United States Patent [19]

Akaogi et al.

[11] Patent Number: 5,197,030
[45] Date of Patent: Mar. 23, 1993

[54] SEMICONDUCTOR MEMORY DEVICE HAVING REDUNDANT MEMORY CELLS

[75] Inventors: Takao Akaogi, Inagi; Mitsuo Higuchi, Nakamachi, both of Japan

[73] Assignee: Fujitsu Limited, Kanagawa, Japan

[21] Appl. No.: 570,057

[22] Filed: Aug. 20, 1990

[30] Foreign Application Priority Data

Aug. 25, 1989 [JP] Japan .................. 1-219973

[51] Int. Cl.$^5$ .................................. G11C 7/00
[52] U.S. Cl. .............................. 365/200; 365/203; 365/233; 365/233.5
[58] Field of Search ............... 365/200, 202, 203, 233, 365/233.5, 194; 371/10.1, 10.2, 10.3

[56] References Cited

U.S. PATENT DOCUMENTS

| | | | |
|---|---|---|---|
| 4,558,435 | 12/1985 | Hsieh | 365/203 |
| 4,616,344 | 10/1986 | Noguchi et al. | 365/203 |
| 4,707,811 | 11/1987 | Takemae et al. | 365/239 |
| 4,800,552 | 1/1989 | Koshizuka et al. | 365/202 |
| 4,849,938 | 7/1989 | Furutani et al. | 365/203 |
| 4,905,192 | 2/1990 | Nogami et al. | 365/200 |
| 4,953,130 | 8/1990 | Houston | 365/203 |

FOREIGN PATENT DOCUMENTS

| | | |
|---|---|---|
| 0121394 | 10/1984 | European Pat. Off. . |
| 0124900 | 11/1984 | European Pat. Off. . |
| 59-63091 | 4/1984 | Japan .................. 365/233.5 |
| 63-24494 | 11/1988 | Japan . |

OTHER PUBLICATIONS

IEEE Journal of Solid State Circuits, vol. 20, No. 5, Oct. 1985, pp. 941-950, Sood et al., "A Fast 8K×8 CMOS SRAM With Internal Power Down Design Techniques".

IBM Technical Disclosure Bulletin, vol. 29, No. 4, Sep. 1986, pp. 1575-1578, "Method to Reconfigure Logic Signal Paths."

Primary Examiner—Joseph L. Dixon
Assistant Examiner—Jack A. Lane
Attorney, Agent, or Firm—Armstrong, Westerman, Hattori, McLeland & Naughton

[57] ABSTRACT

A semiconductor memory device includes a memory cell array, a data readout circuit, a decoder circuit and an address transition detecting circuit which detects an address transition of an input address signal and which generates an address transition detection pulse. A redundancy circuit determines whether or not the input address signal indicates a defective memory cell and outputs a redundancy signal to the decoder so that the decoder selects one redundant memory cell in place of the specified defective memory cell. A pulse generator generates a pulse signal having a pulse duration time sufficient to reset the memory cell array and the data readout circuit before reading data from the memory cell array in a case where the redundancy circuit outputs the redundancy signal. The pulse duration time of the pulse signal starts from a time when the address transition detecting circuit generates the address transition signal.

11 Claims, 6 Drawing Sheets

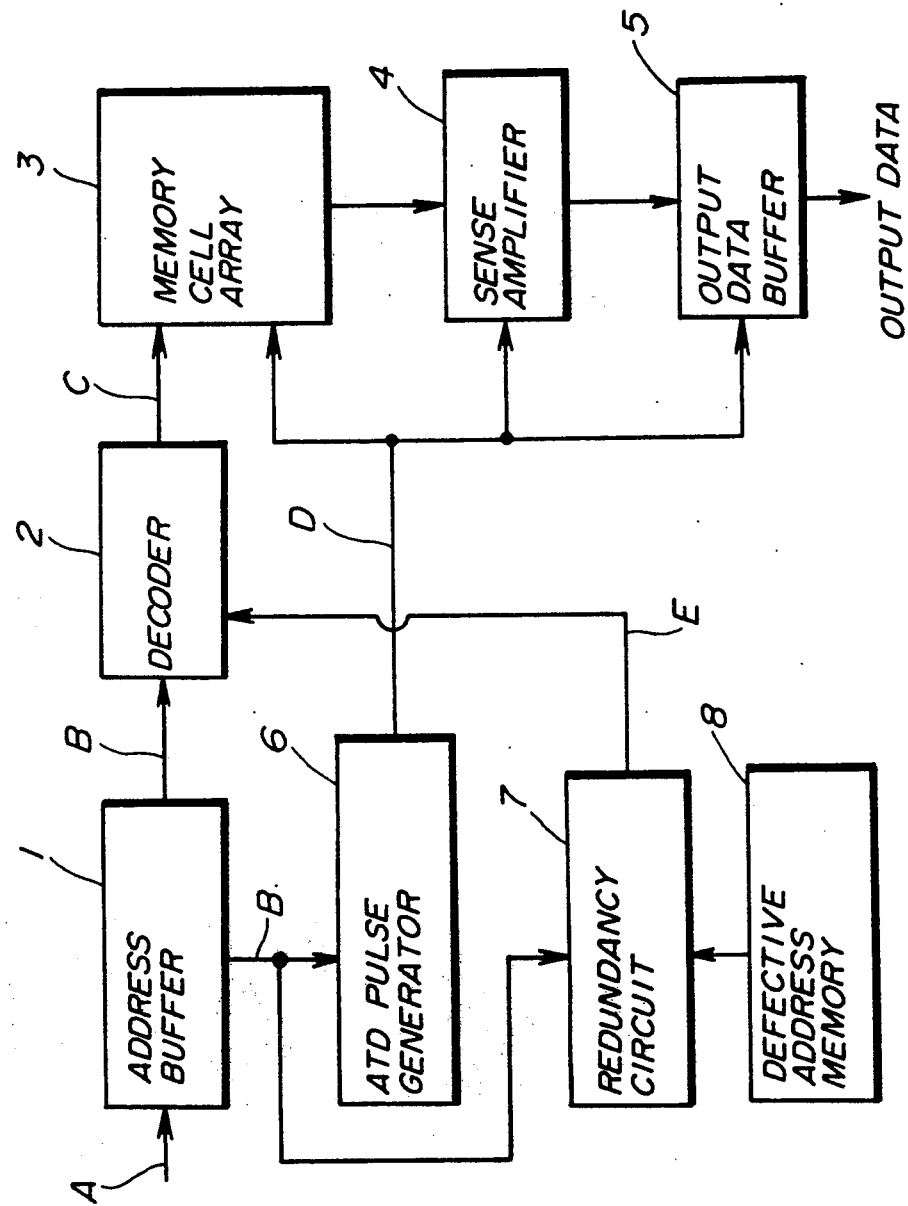
FIG. IA PRIOR ART

SEMICONDUCTOR MEMORY DEVICE HAVING REDUNDANT MEMORY CELLS

BACKGROUND OF THE INVENTION

The present invention generally relates to a semiconductor memory device having redundant memory cells, and more particularly to an improvement in reading of data from a memory cell array.

Recently, it has been required to increase the storage capacity of semiconductor memory devices. For this requirement, a huge number of memory cells are arranged in an IC chip. The number of defective memory cells increase when there is a reduction in the size of each memory cell. In order to cope with this problem, a predetermined number of redundant memory cells are arranged in the memory cell array. On the other hand, it is required to increase the operation speed of the device together with a reduction in the size of memory cells. For this requirement, an address transition detector is employed.

Referring to FIG. 1A, there is illustrated a conventional semiconductor memory device (an erasable programmable read only memory device), which has redundant memory cells and the address transition detector. An input address signal A generated and output by an external device, such as a central processing unit, is input to an address buffer 1. The address buffer 1 generates an address buffer output signal B corresponding to the input address signal A, and sends the same to a decoder 2, an address transition detection pulse generator (hereinafter simply referred to an ATD pulse generator) 6 and a redundancy circuit 7.

The decoder 2 decodes the address buffer output signal B and outputs a decode output signal C to a memory cell array 3. The decode output signal C specifies one word line and one bit line provided in the memory cell array 3. Thereby, a memory cell coupled to the selected word line and the selected bit line is selected.

On the other hand, the ATD pulse generator 6 detects an address transition from the address buffer output signal B and generates, therefrom, an ATD pulse signal D having a predetermined pulse duration time $t_1$ (hereinafter also referred to as a reset time). The ATD pulse signal D is sent to the memory cell array 3, a sense amplifier 4 and a data output buffer 5. During the reset time $t_1$, the bit lines in the memory cell array 3, the sense amplifier 4 and the data output buffer 5 are reset so that the device is set in a data read enable state. For example, during the reset time, the bit lines in the memory cell array 3 are precharged to a predetermined precharge voltage (approximately 1 volt, for example). The sense amplifier 4 has a differential amplifier having two input terminals coupled to a pair of bit lines. During resetting, two input terminals are short-circuited (equalized) so that they become equal to an identical potential. Output transistors in the data output buffer 5 are set to a high-impedance state during the reset time.

Addresses of defective memory cells are stored in a defective address memory 8. The addresses of defective memory cells are obtained by a predetermined test. The redundancy circuit 7 compares the input address signal A with the addresses of the defective memory cells, and determines whether or not the input address signal A indicates one of the defective memory cells. When it is determined that the input address signal A indicates one of the defective memory cells, the redundancy circuit 7 outputs a redundancy signal E to the decoder 2. In response to the redundancy signal E, the decoder 2 decodes the address buffer output signal B again and outputs the decode output signal C which specifies a corresponding spare (redundant) memory cell provided in the memory cell array 3. In this way, the accessed defective memory cell is replaced by the specified spare memory cell.

FIG. 1B shows a detailed configuration of the memory cell array 3. As shown, the memory cell array 3 is composed of memory cells MC coupled to bit lines and word lines, and redundant memory cells RMC coupled to bit lines and word lines. The memory cells MC contain defective memory cells.

However, the semiconductor memory device shown in FIG. 1 has the following disadvantages, which will be explained below with reference to FIG. 2. An address transition occurs at time $t_0$ (FIG. 2-(a)). At this time, the ATD pulse signal D is generated by the ATD pulse generator 6 (FIG. 2-(b)). The ATD pulse D has a high level during the time $t_1$. As has been described previously, during the time $t_1$, the memory cell array 3, the sense amplifier 4 and the data output buffer 5 are reset. As shown in FIG. 2-(c), due to the comparison operation in the redundancy circuit 7, the redundancy signal E rises with a delay time $t_2$ from the address transition time $t_0$. That is, the rise of the redundancy signal E lags behind that of the ATD pulse signal by time $t_2$. As a result, in actuality, the reset time is reduced by time $t_2$ so that it becomes equal to $t_3$ ($=t_1-t_2$). In this case, there is a possibility that the memory cell array 3, the sense amplifier 4 and the data output buffers will not be completely reset when the time $t_1$ elapses. For example, the bit lines in the memory cell array 3 are not completely precharged during the reduced reset time. The sense amplifier 4 is not completely equalized. In other words, data is read out before the specified redundant memory cell is completely selected. If data is read out from the memory cell array 3 immediately after the elapse of the time $t_1$, there is a high possibility of an error being contained in the readout data.

SUMMARY OF THE INVENTION

It is a general object of the present invention to provide an improved semiconductor memory device, in which the above-mentioned problems are eliminated.

A more specific object of the present invention is to provide a semiconductor memory device in which a sufficient reset time is ensured without decreasing the data readout speed.

The above-mentioned objects of the present invention are achieved by a semiconductor memory device comprising a memory cell array having memory cells which include memory cells and redundant memory cells; data readout means, coupled to the memory cell array, for reading out data from the memory cell array; and decoder means, coupled to the memory cell array, for decoding an input address signal and generating a decoded address signal which identifies at least one of the memory cells. The semiconductor memory device also comprises address transition detecting means for detecting an address transition of the input address signal and for generating an address transition detection pulse; redundancy circuit means, coupled to the decoder means, for determining whether or not the input address signal indicates a defective memory cell which is one of the memory cells and for outputting a redundancy signal to the decoder means so that the decoder means selects one of the redundant memory cells in place of the defective memory cell; and pulse generating means, coupled to the redundancy circuit means and the address transition detecting means, for generating a pulse signal having a pulse duration time sufficient to reset the memory cell array and the data readout means before reading data from the memory cell array in a case where the redundancy circuit means outputs the redundancy signal. The pulse duration time of the pulse signal starts from a time when the address transition detecting means generates the address transition signal.

BRIEF DESCRIPTION OF THE DRAWINGS

Other objects, features and advantages of the present invention will become more apparent from the following detailed description when read in conjunction with the accompanying drawings, in which:

FIG. 1A is a block diagram of a conventional semiconductor memory device having redundancy memory cells;

DESCRIPTION OF THE PREFERRED EMBODIMENT

Figure 1B:
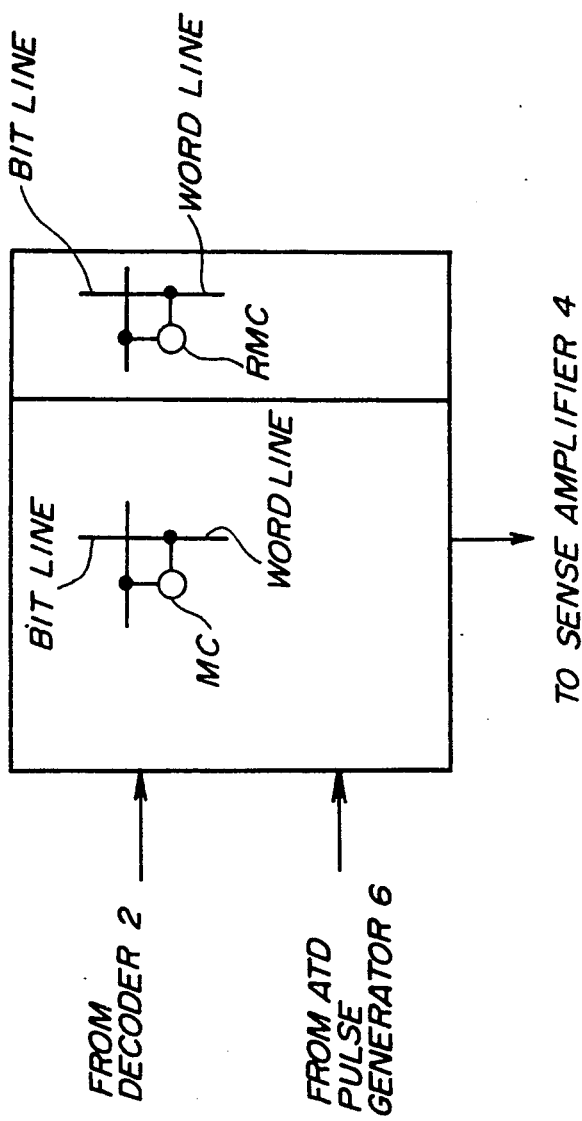
FIG. 1B is a block diagram of a memory cell array shown in FIG. 1A.
Figure 2:
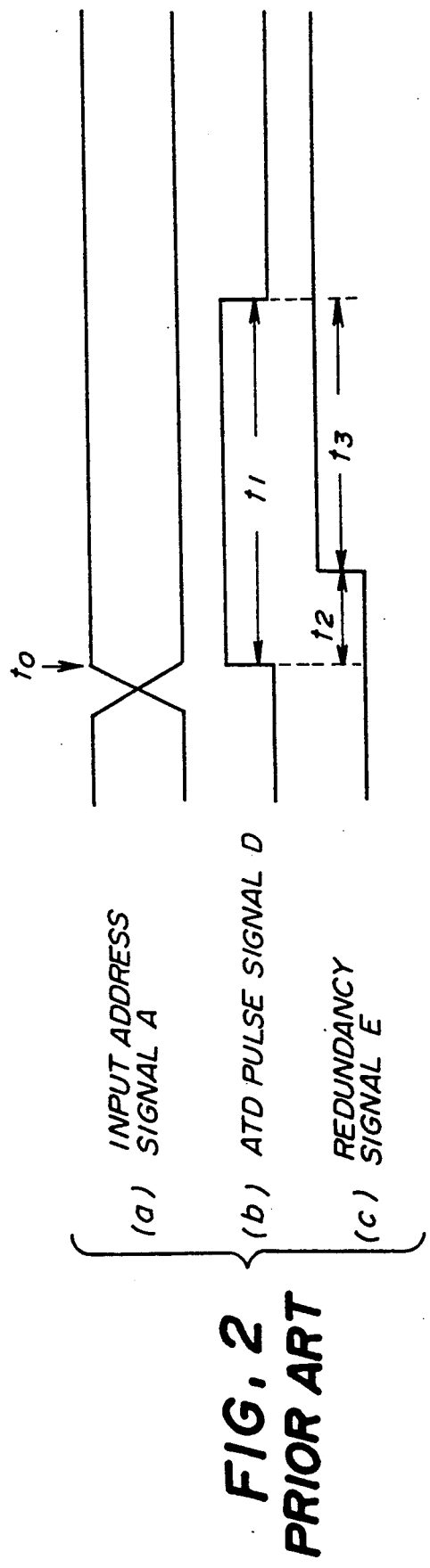
FIG. 2 is a waveform diagram illustrating the operation of the conventional semiconductor memory device shown in FIG. 1A.
Figure 3:
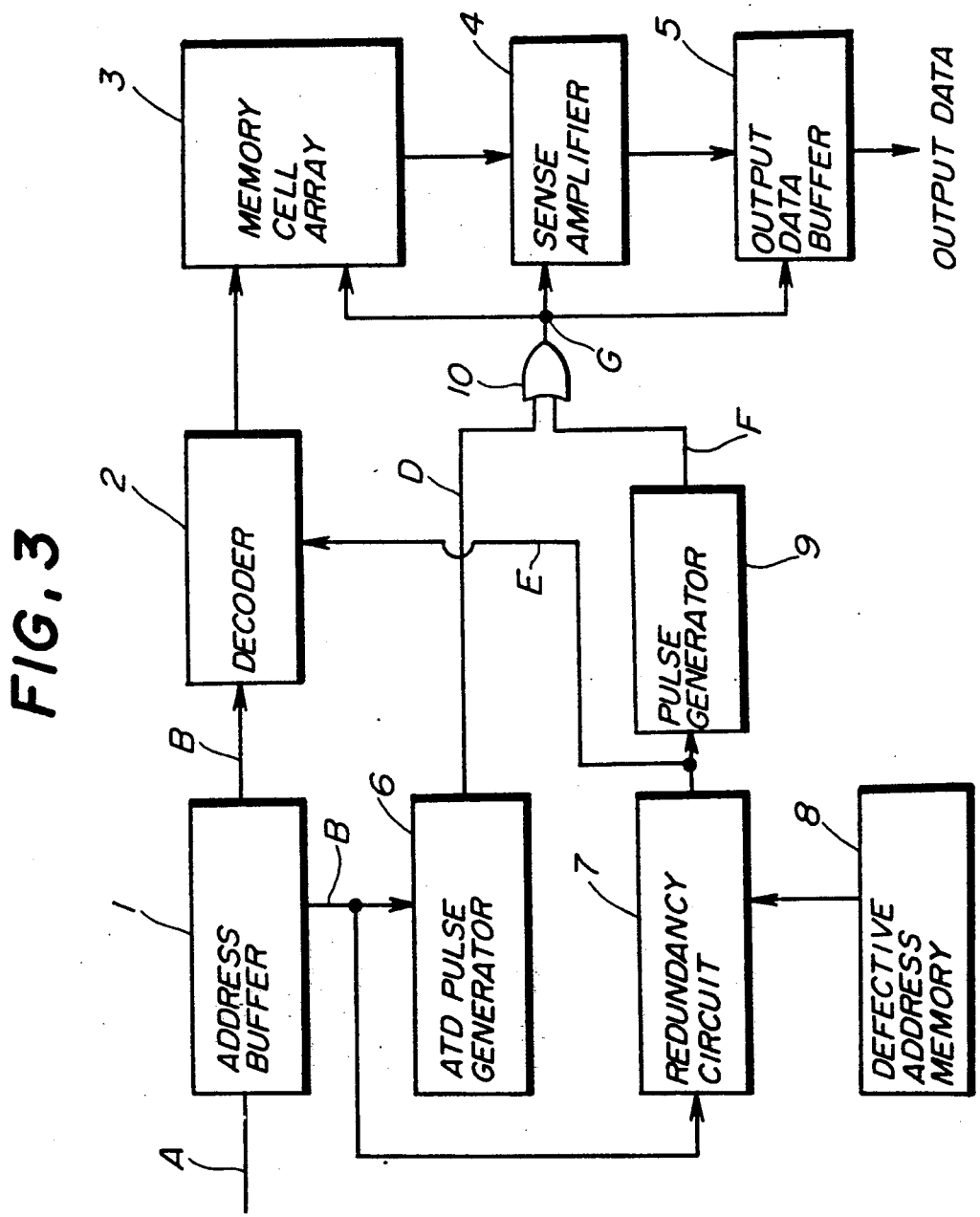
FIG. 3 is a block diagram of a semiconductor memory device according to a preferred embodiment of the present invention.

Referring to FIG. 3, there is illustrated a semiconductor memory device according to a preferred embodiment of the present invention. In FIG. 3, those parts which are the same as those shown in FIG. 1A are given the same reference numerals. According to the preferred embodiment of the present invention, a pulse generator 9 and an OR gate 10 are added to the configuration shown in FIG. 1. The pulse generator 9 has an input terminal connected to the redundancy circuit 7 and an output terminal coupled to one of the two input terminals of the OR gate 10. The other input terminal of the OR gate 10 is connected to the ATD pulse generator 6.

When receiving the redundancy signal E, the pulse generator 9 generates a shift pulse signal F having a pulse duration time substantially equal to the aforementioned pulse duration time $t_1$ or longer. The shift pulse signal F is input to the OR gate 10. The OR gate 10 receives the shift pulse signal F and the ATD pulse signal D generated and output by the ATD pulse generator 6, and outputs an OR output signal G to the memory cell array 3, the sense amplifier 4 and the output buffer 5. The OR output signal G output by the OR gate 10 rises in synchronism with the rise of one of the two signals which is in advance of the other signal and falls in synchronism with the fall of one of the two signals which is behind the other signal. That is, the OR output signal G rises in synchronism with the rise of the ATD pulse signal D and falls in synchronism with the shift pulse signal F.

A description will now be given of the operation of the semiconductor memory device shown in FIG. 3 with reference to FIG. 4. An address transition of the input address signal A (FIG. 4-(a)) at time $t_0$ is detected by the ATD pulse generator 6, which generates the ATD pulse signal D (FIG. 4-(b)), which is supplied to the OR gate 10. At this time, if the input address signal A does not indicate a defective memory cell in the memory cell array 3, the ATD pulse signal D having the reset time $t_1$ passes through the OR gate 10, and is applied to the memory cell array 3, the sense amplifier 4 and the output buffer 5. Thereby, the memory cell array 3, the sense amplifier 4 and the output buffer 5 are reset during the reset time $t_1$ and then the device is ready for data readout operation.

Figure 4:
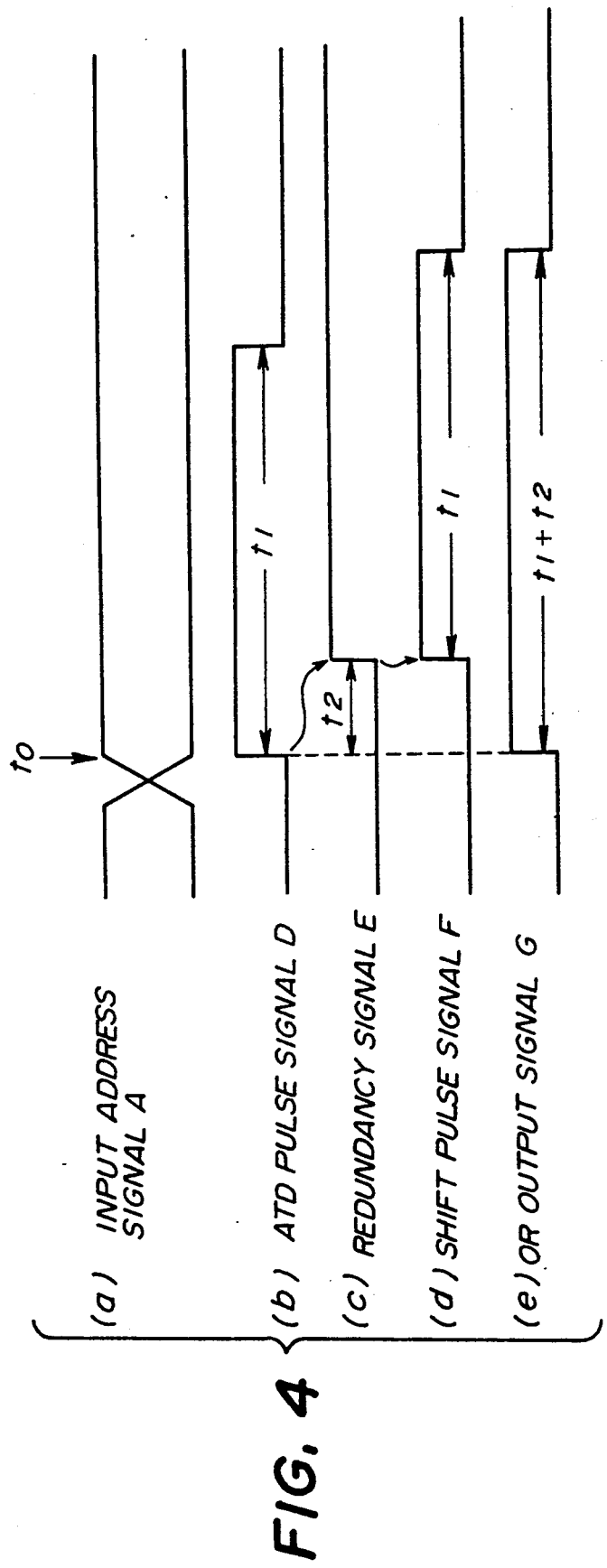
FIG. 4 is a waveform diagram illustrating the operation of the semiconductor memory device shown in FIG. 3.

On the other hand, if the input address signal A indicates a defective memory cell, the redundancy circuit 7 outputs the redundancy signal E with a delay of time $t_2$ from the time $t_0$ (FIG. 4-(c)). The redundancy signal E is sent to the decoder 2 and the pulse generator 9. In response to the redundancy signal E, the decoder 2 starts to select a spare memory cell which is to be substituted for the specified defective memory cell. On the other hand, the pulse generator 9 outputs the shift pulse F in synchronism with the rise of the redundancy signal E (FIG. 4-(e) and 4-(d)). The shift pulse signal F is input to the OR gate 10. At this time, the OR gate 10 has already been supplied with the ATD pulse signal D. As has been described previously, the shift pulse signal F has a pulse duration time substantially equal to or longer than the pulse duration time $t_1$ of the ATD pulse signal D. As a result, the OR gate signal G drawn from the OR gate 10 has a pulse duration time equal to the sum of $t_2$ and $t_1$ ($G = t_1 + t_2$). The OR gate signal G is applied to the memory cell array 3, the sense amplifier 4 and the data output buffer 5. Thereby, these elements are completely reset. Although the access time becomes longer by $t_2$, an accurate read operation is made available.

Figure 5:
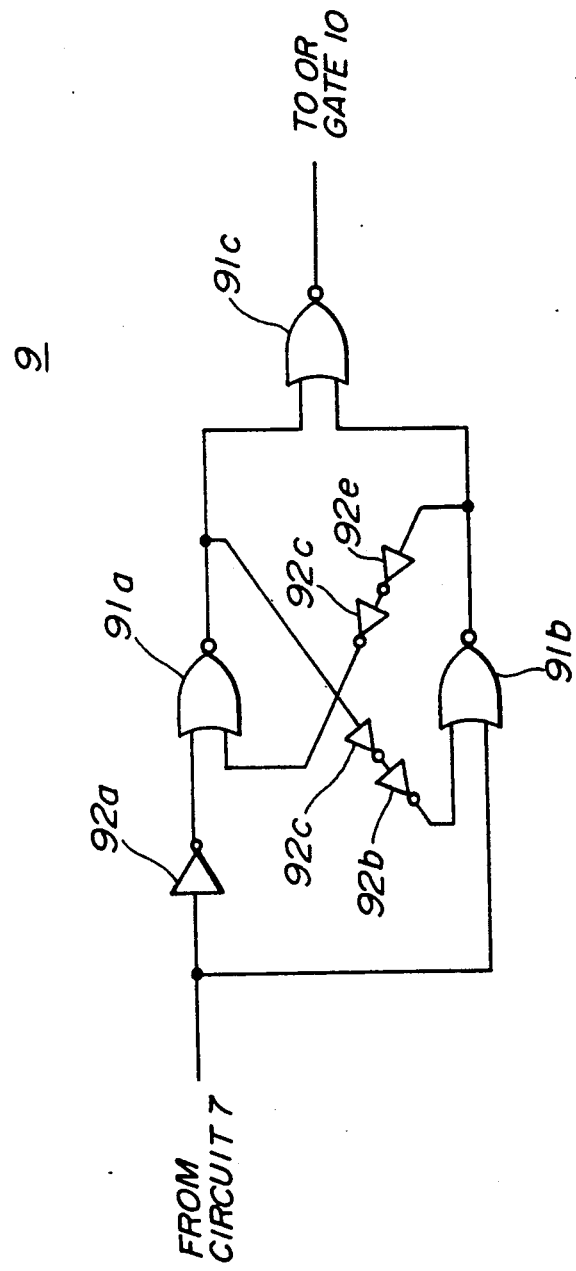
FIG. 5 is a circuit diagram of a pulse generator shown in FIG. 3.

FIG. 5 is a circuit diagram of the pulse generator 9. As shown, the pulse generator 9 is composed of three NOR gates 91a, 91b and 91c, and inverters 92a, 92b, 92c, 92d and 92e. The inverters 92b and 92c function as a delay element. Similarly, the inverters 92d and 92e function as a delay element. The ATD pulse signal D generated and output by the ATD pulse generator 6 is input to the NOR gate 91a via the inverter 92a and also directly to the NOR gate 91b. An output signal of the NOR gate 91a is input to the NOR gate 91b via the delay element consisting of the inverters 92b and 92c and also directly to the NOR gate 91c. An output signal of the NOR gate 91b is input to the NOR gate 91a through the delay element consisting of the inverters 92d and 92e and also directly to the NOR gate 91c. The shift pulse signal G is drawn from the NOR gate 91c.

When the ATD pulse signal D is changed from a low level to a high level, the output signal of the NOR gate 91b is changed from the high level to the low level. In response to this potential change at the output of the NOR gate 91b, the output signal of the NOR gate 91a is changed from the low level to the high level. Thus, the shift pulse signal G is changed from the low level to the high level. The shift pulse signal G has a pulse width (pulse duration time) based on a delay amount provided by each of the two delay elements.

The present invention can be applied to an erasable programmable read only memory, a dynamic random access memory device or a static random access memory. The data output buffer 5 has an input buffer to which write data is input. The write data passes through the sense amplifier 4 and is written into the memory cell array 3.

The present invention is not limited to the specifically disclosed embodiment, and variations and modifications may be made without departing from the scope of the present invention.

What is claimed is:

1. A semiconductor memory device comprising:
   a memory cell array having memory cells which include memory cells and redundant memory cells;
   data readout means, coupled to said memory cell array, for reading out data from said memory cell array;
   decoder means, coupled to said memory cell array, for decoding an input address signal and generating a decoded address signal which identifies at least one of said memory cells;
   address transition detecting means for detecting an address transition of said input address signal and for generating an address transition detection pulse;
   redundancy circuit means, coupled to said decoder means, for determining whether or not said input address signal indicates a defective memory cell which is one of said memory cells and for outputting a redundancy signal to said decoder means so that said decoder means selects one of said redundant memory cells in place of said defective memory cell; and
   pulse generating means, coupled to said redundancy circuit means and said address transition detecting means, for generating a pulse signal having a duration sufficient to reset said memory cell array, wherein said pulse has a greater duration than said address transition detection pulse when said redundancy circuit means outputs said redundancy signal, and said pulse has a duration equal to said address transition detection pulse when said redundancy circuit means does not output said redundancy signal, the pulse duration time of said pulse signal starting from a time when said address transition detecting means generates said address transition signal.

2. A semiconductor memory device as claimed in claim 1, wherein said pulse generating means comprises:
   a pulse generator which generates a shift pulse signal having a predetermined pulse width in synchronism with a timing when said redundancy circuit means generates said redundancy signal; and
   logic circuit means, coupled to said pulse generator and said address transition detecting means, for receiving said shift pulse signal and said address transition detection signal and for generating said pulse signal.

3. A semiconductor memory device as claimed in claim 2, wherein said logic circuit means comprises an OR gate having a first input terminal for receiving said shift pulse signal, a second input terminal for receiving said address transition detection signal, and an output terminal through which said pulse signal is output.

4. A semiconductor memory device as claimed in claim 2, wherein the predetermined pulse width of said shift pulse signal is substantially equal to a pulse width of said address transition detection signal.

5. A semiconductor memory device as claimed in claim 2, wherein the predetermined pulse width of said shift pulse signal is greater than a pulse width of said address transition detection signal.

6. A semiconductor memory device as claimed in claim 2, wherein said pulse generator comprises:
   first, second and third NOR gates, each having first and second input terminals and an output terminal;
   an inverter which receives said redundancy signal and outputs an inverted version of said redundancy signal to the first input terminal of said first NOR gate;
   a first delay element connected between the output terminal of said first NOR gate and the first input of said second NOR gate; and
   a second delay element connected between the output terminal of said second NOR gate and the second input terminal of said first NOR gate, and wherein:
   the second input terminal of said second NOR gate receives said address transition detection signal;
   the output terminals of said first and second NOR gates are connected to the first and second input terminals of said third NOR gates; and
   the output terminal of said third NOR gate outputs said shift pulse signal.

7. A semiconductor memory device as claimed in claim 6, wherein each of said first and second delay elements has a delay of time which determines the predetermined pulse width of said shift pulse signal.

8. A semiconductor memory device as claimed in claim 6, wherein each of said first and second delay elements comprises inverters connected in series.

9. A semiconductor memory device as claimed in claim 1, wherein said semiconductor memory device is an erasable programmable read only memory device.

10. A semiconductor memory device as claimed in claim 1, wherein said semiconductor memory device is a random access memory device.

11. A semiconductor memory device as claimed in claim 1, wherein said semiconductor memory device is a static access memory device.

* * * * *